United States Patent [19]

Kieser

[11] Patent Number: 4,630,568
[45] Date of Patent: Dec. 23, 1986

[54] APPARATUS FOR COATING SUBSTRATES BY PLASMA POLYMERIZATION

[75] Inventor: Jörg Kieser, Albstadt, Fed. Rep. of Germany

[73] Assignee: Leybold-Heraeus GmbH, Cologne, Fed. Rep. of Germany

[21] Appl. No.: 736,556

[22] Filed: May 21, 1985

Related U.S. Application Data

[63] Continuation-in-part of Ser. No. 716,513, Mar. 26, 1985, abandoned, which is a continuation of Ser. No. 556,847, Dec. 1, 1983, abandoned.

[30] Foreign Application Priority Data

Dec. 1, 1982 [DE] Fed. Rep. of Germany ....... 3244391

[51] Int. Cl.[4] .............................................. C23C 16/00
[52] U.S. Cl. .................... 118/723; 118/715; 118/724; 118/729; 118/733; 118/50.1
[58] Field of Search ...................... 118/50.1, 723, 733, 118/724, 715, 665, 729; 427/41; 422/186, 186.06; 219/10.55 A

[56] References Cited

U.S. PATENT DOCUMENTS

| 4,217,856 | 8/1980 | Kraus ................................ 118/724 |
| 4,316,430 | 2/1982 | Jolly et al. ...................... 118/729 X |
| 4,401,054 | 8/1983 | Matsuo et al. ................. 118/723 X |
| 4,423,701 | 1/1984 | Nath et al. ...................... 118/723 X |

FOREIGN PATENT DOCUMENTS 3147986 6/1983 Fed. Rep. of Germany .

Primary Examiner—Richard Bueker
Attorney, Agent, or Firm—Felfe & Lynch

[57] ABSTRACT

Apparatus for coating substrates by means of a reaction for depositing atoms or molecules which is initiated by a plasma. A reaction chamber (1) is equipped with at least one window (22, 23), penetrable by microwaves, with at least one wave-guide structure (16, 17), arranged outside the chamber (1) and in front of the window (22, 23), and with a distributing means (25) discharging into the chamber.

According to the invention and for the purpose of achieving the object of facilitating inspection and repairs, the window (22, 23) penetrable by microwaves, the one or more wave-guide structures (16, 17) and the distributing means (25) are all secured in or on a support frame (10), which can be removed, or swung away, from the reaction chamber (1) as a single unit.

11 Claims, 8 Drawing Figures

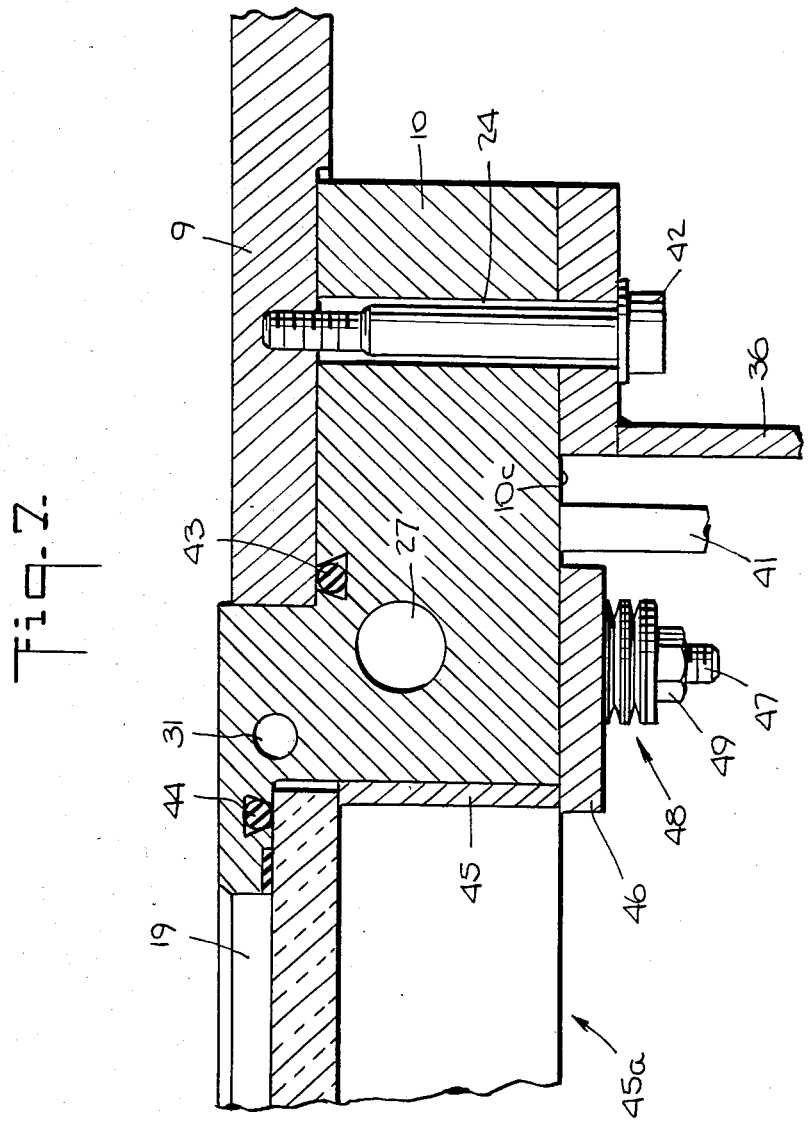

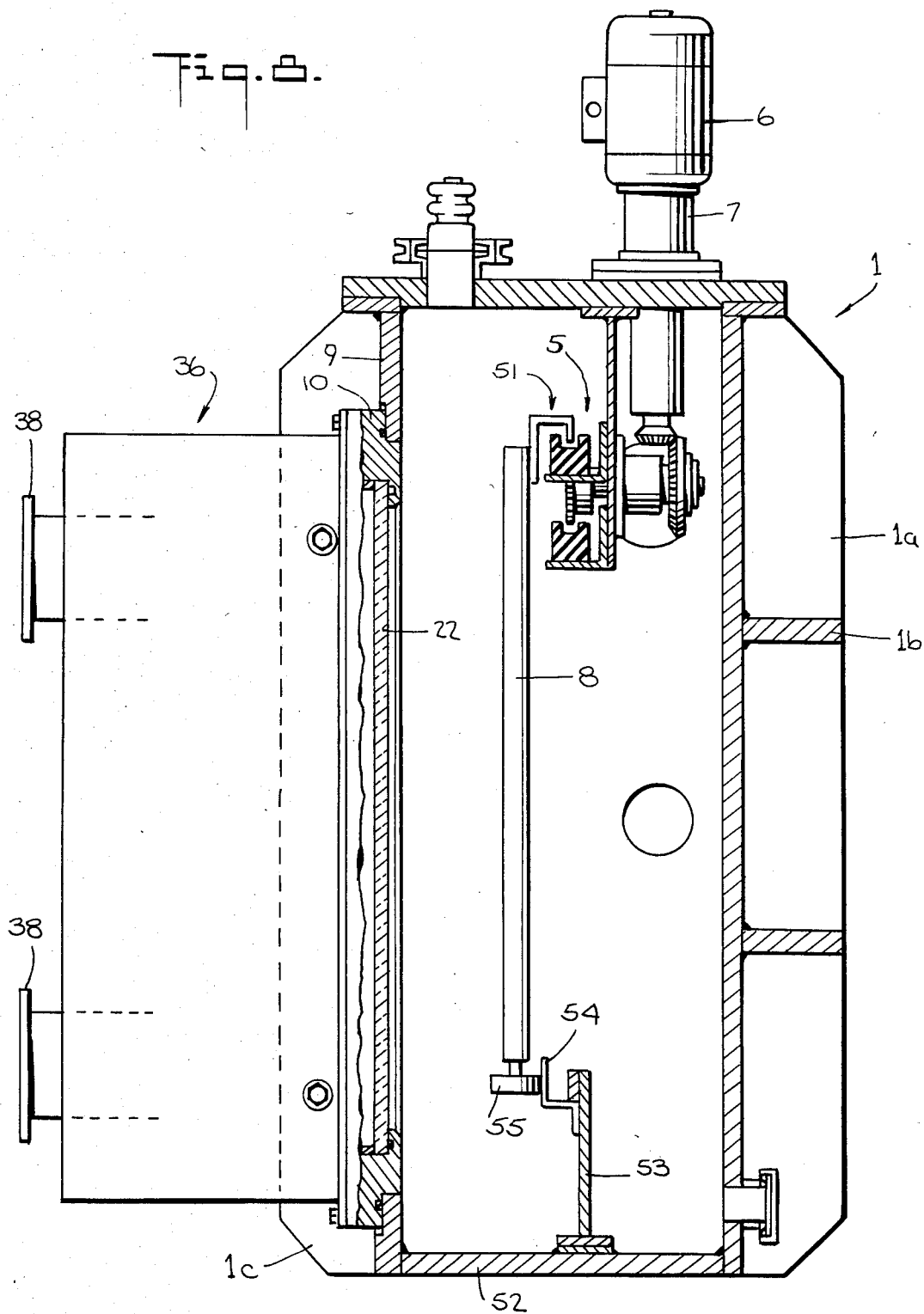

ial amount of adjustment procedures with respect to a
APPARATUS FOR COATING SUBSTRATES BY PLASMA POLYMERIZATION This application is a continuation-in-part of my U.S. patent application Ser. No. 716.513, filed Mar. 26, 1985 now abandoned, which is a continuation of my application U.S. patent application Ser. No. 556,847, filed Dec. 1, 1983 now abandoned.

The invention relates to apparatus for coating substrates by means of a reaction for depositing atoms or molecules which is initiated by a plasma, which apparatus comprises: a reaction chamber for transporting the substrates and for maintaining an atmosphere comprising ionized gas and a monomer (or an ionized gas comprising a monomer which is ionized, for example, a gaseous hydrocarbon compound which is ionized) and having, in one of its walls, at least one window penetrable by microwaves; at least one wave-guide structure arranged outside the chamber and in front of the window; and means for distributing the gas and/or monomer which discharges into the chamber.

The subject-matter of the invention is used in the plasma polymerization of monomers, in forming what are called amorphous carbon layers from monomeric hydrocarbons, as well as in chemical deposition reactions of all kinds, such as polycondensation, the formation of nitrides etc., wherein the activating energy is supplied by a plasma.

Equipment of the above-described kind forms the subject-matter of DE-OS No 31 47 986. The wave-guide structure is also described therein. This consists of two straight beams, which run parallel to each other and between which extend bars of equal length which are in metallic contact with the beams. The bars are alternately electrically-conductively connected to one of two central conductors. At one of its ends, the wave-guide structure is connected through a hollow conductor to a microwave emitter, and at its other end it is connected through a further hollow conductor to a reactive load. The wave-guide structure extends at a sharp angle to the window which is penetrable by the microwaves and through which power is fed into the plasma burning in the interior of the reaction chamber.

However, experience has shown that, in the zone of the window, penetrable by microwaves, polymerized layers are deposited in the interior of the reaction chamber, and these have to be periodically removed by cleaning. The means for distributing the gas and/or monomer also have to be cleaned from time to time, and this is made difficult in the known equipment because said means are difficult to reach.

An object of the present invention is, therefore, to provide an improved form of equipment of the initially described kind wherein supervision and repairs can be carried out more easily.

According to the invention and in the case of the initially described equipment, this object is achieved in that the window, penetrable by microwaves, the one or more wave-guide structure or structures and the distributing means are secured jointly in or on a support frame, which can be removed or swung away, from the reaction chamber as a unit.

By means of the measures proposed by the invention, all of the parts of the equipment that are functionally important as regards the production of plasma are combined to form a single unit which, when the support frame has been detached, can be removed so far from the reaction chamber that cleaning, inspection, etc. become possible. The support frame can be completely disconnected from the reaction chamber and the entire unit can be brought, by means of lifting tackle, to a location where cleaning can be comfortably carried out. Alternatively, however, it is also possible to secure the support frame to the reaction chamber by means of a hinge connection, so that accessibility is achieved by swinging the support frame away together with the wave-guide structure.

It is preferred to use two wave-guide structures in an anti-parallel arrangement. Furthermore, using this kind of wave-guide structures ordinarily requires a substantial amount of adjustment procedures with respect to a very specific alignment of the structures. This alignment, i.e., the original setting, has to remain essentially constant during the life-time of the apparatus.

As regards the use of two wave-guide structures in an anti-parallel arrangement as described in DE-OS No. 31 47 986, particular advantage is attained if, in accordance with a further feature of the invention, the support frame is of rectangular shape and is provided with two window openings, which extend parallel to the longer sides of the rectangle and between which is located a frame strut and if cooling ducts, surrounding the window openings, are provided in the support frame, and if in addition the distributing means (for gas or for the monomeric vapor) is arranged in the frame strut as well as in the outer portions of the frame.

For the purpose of increasing overall efficiency as well as for reasons of safety, particular advantage accrues if, in accordance with another feature of the invention, the wave-guide structures are surrounded by a common microwave screen at that side facing away from the window openings. This screen is particularly effective if it is provided with curved reflectors on its rear face.

Intentional reflection of the radiation from the rear side of the wave-guide structure, as well as from the connections, decisively increases the power input into the reaction chamber and therefore the efficiency of the equipment. In the literature on the subject, a wave-guide structure (also known as slow wave structure) is also designated as being "normally not radiating". However, this condition is achieved only as long as no power is passed from the wave-guide structure to the plasma. I have observed, however, that an increase in the microwave field at the rear side of the wave-guide structure by a factor of 2.5 takes place after ignition of the plasma. By the use of the described screen, this radiation can also be directed into the plasma, so that further increase in uniformity of the field distribution in the plasma chamber also takes place. Because of the finite spacing of the bars, this field distribution is originally not uniform.

The central frame strut can very advantageously acquire an additional function if, in accordance with yet another feature of the invention, it has a longitudinal bore which communicates with the interior of the reaction chamber through a plurality of equidistantly spaced openings extending at right angles to the longitudinal bore. The distributing effect is further increased by a distributor plate.

In some cases it may be desirable to introduce monomers through additional openings situated in the outer portions of the frame.

As a result of the above-mentioned measure, the monomer emerges through the said central openings over the entire length of the window and is guided into the plasma zone by the distributor plate as a directed flat stream. At the operating pressures of above 0.01 to, say, a few mbars, that are usual in such processes, pure laminar flow prevails, so that the expression "directed stream" is justified. The uniformity of the layer on the substrate, which (in the case of a film) oscillates or moves in a uniform manner behind the microwave window, is influenced, i.e. corrected, by the size of the gap, formed by the distributor plate and the inner face of the window flange, and by the adjustable flow of monomer material.

Further considerable advantage is achieved if, in accordance with a still further feature of the invention, the main plane of the support frame, i.e. of the window, is disposed vertically.

It has in fact been observed that polymer layers, which break off into flakes, form on the support frame, i.e. on the windows. The vertical arrangement of the main plane prevents these flakes both from remaining on the window and falling onto the substrate. When conveying substrates which are arranged in a vertical plane but are moved in the horizontal direction, it is expedient also to arrange the longer axes of the windows, i.e. the frame struts located between the windows, in a vertical position. In the case where the substrates are arranged in the vertical plane and are also moved in the vertical direction, it may be of advantage if the main axis of the windows, i.e. of the frame strut, extends in the horizontal direction. A construction of this kind can be used with particular advantage in installations for the coating of strip.

The input of power into the reaction chamber through the window or windows is generally not constant over the length of the wave-guide structure. Because of the sharp angle at which the wave-guide structure is set in relation to the window, a certain uniformity of energy input can in fact be achieved, but absolute uniformity is hardly possible. According to another feature of the invention and for the purpose of further increasing uniformity of power input, adjustable shields are arranged between the wave-guide structures and the window openings. These shields are very advantageously formed by narrow strips of sheet metal and they extend substantially parallel to the window openings and are displaceable transversely of the window opening at both ends and independently of each other. The adjustable shields are also present particularly in the zone of the means whereby the wave-guide structure is connected to the hollow conductors of microwave emitters and the reactive load. Because displacement is possible, a considerable increase in uniformity of the power input can be achieved by means of the adjustable shields, and the longitudinal edges of these shields may also be of a shape other than rectilinear.

The shape of the edges of the shields is preferably curved in such a manner as to minimize any nonuniformities of the plasma.

The heating up of the windows, penetrable by microwaves, has proved to constitute a considerable problem. In microwave plasma polymerization, the microwave energy is beamed through the window into the reaction chamber in concentrated form. The plasma, maintained in this way, is at its greatest power density immediately at the inner face of the window. The power density diminishes exponentially in the direction of lines at right angles to the window. Whereas the heating up of the window due to absorption of the microwave energy passing therethrough is negligible, it is nevertheless necessary to take into account that, because of the distribution of power density in the plasma, the major part of the power contained in the plasma is released in the form of heat at the inner face of the window. Further heating up of the windows can be caused by hot substrates and by means that may be used for heating them.

The quartz glass that is normally used for the windows is a poor conductor of heat and its thermal conductivity is about $\frac{1}{8}$ of that of refined steel. Appreciable lateral dissipation of heat would require temperature differences of approximately 600° K. if a surface loading of 1 W/cm$^2$ of the window surface is assumed to be typical. However, temperatures of this order cannot be tolerated by the elastomeric vacuum seals which have to be provided between the windows and the support frames. The rate at which the windows heat up is so great that the critical temperature of 180° C., which applies as regards the sealing material "Viton", is exceeded even after a few minutes. Adequate cooling of the windows by forced convection is not possible with means that could be tolerated.

Therefore, according to another feature of the invention and for the purpose of achieving effective cooling of the windows, penetrable by microwaves, the support frame comprises an outwardly directed flange for sealed connection to the reaction chamber and an inwardly directed flange for sealed connection to the window, penetrable by microwaves, and a heat-conducting flexible intermediate layer is arranged on the inner edge of the inwardly directed flange, while a seal is arranged on the outer edge of the window and outside the intermediate layer. This step is to be regarded as being taken in conjunction with that of providing the support frame, including the frame strut, with cooling ducts.

As a result of arranging the heat-conducting flexible intermediate layer in front of the elastomeric vacuum seal, (as seen in the direction of thermal flow) a kind of thermal short-circuiting occurs, whereby a considerable portion of the heat is dissipated before reaching the vacuum seal on the cooled support frame.

Material that can be considered for the heat-conducting flexible intermediate layer is one having limited plastic deformability, and the thermal conductivity of which is appreciably greater than that of quartz glass. Particularly well suited for this purpose is graphite felt or graphite film. This material can be arranged directly adjacent to the vacuum seal in the form of a strip approximately 4 mm wide and 1 mm thick so that a reduction of the maximum window temperature to approximately 100° C. in the vicinity of the vacuum seal can be achieved. A temperature of this order can also be readily withstood by the elastomeric vacuum seal.

In accordance with the invention, apparatus for coating substrates by means of a reaction for depositing atoms or molecules which is initiated by a plasma, comprises a reaction chamber, including means for transporting the substrates, for containing an atmosphere comprising ionized gas and having, in one of its walls, one or more windows penetrable by microwaves. The apparatus also includes one or more wave-guide structures disposed outside the chamber and in front of the one or more windows. The apparatus also includes means for distributing gas in the chamber, and a support frame at the reaction chamber. The one or more windows, penetrable by microwaves, the one or more wave-guide structures and the distributing means are secured jointly to the support frame. The one or more windows, penetrable by microwaves, the one or more wave-guide structures and the distributing means are secured jointly to the support frame and the support frame is secured to the reaction chamber in such manner that the one or more windows, the one or more wave-guide structures, the distributing means and the support frame are displaceable from the reaction chamber as a unit.

For a better understanding of the invention, together with other and further objects thereof, reference is made to the following description, taken in connection with the accompanying drawings, and its scope will be pointed out in the appended claims.

Referring now to the drawings:

FIG. 7 is a fragmentary, sectional view, to an enlarged scale, of the chamber wall, the support frame and the screen; and FIG. 8 shows schematically on a scale greater than that of FIG. 2, a vertical section through the entire reaction chamber and the support frame in the zone of a window penetrable by microwaves.

Figure 1:
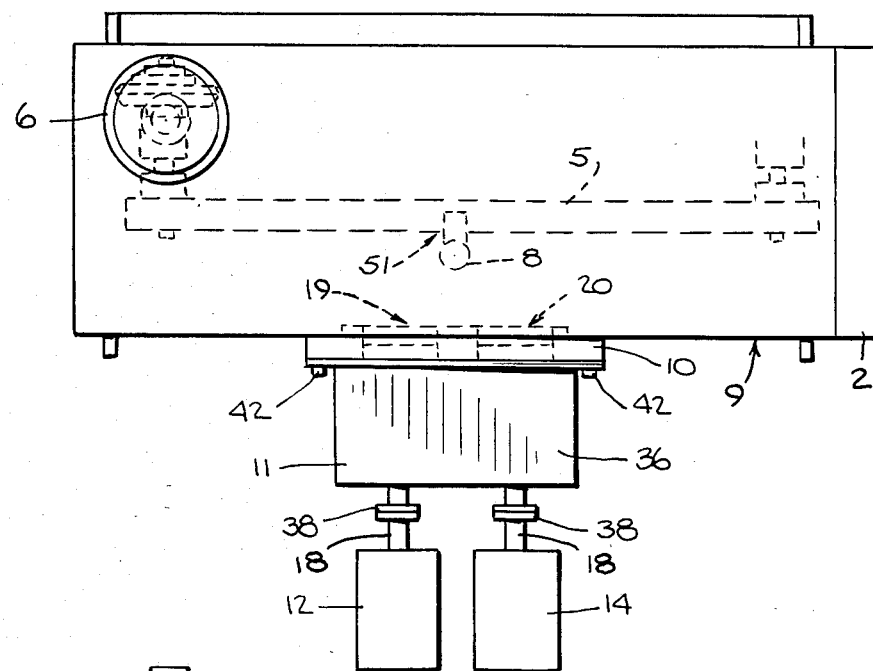
FIG. 1 shows, diagrammatically, a plan view of the complete equipment for plasma polymerization.
Figure 2:
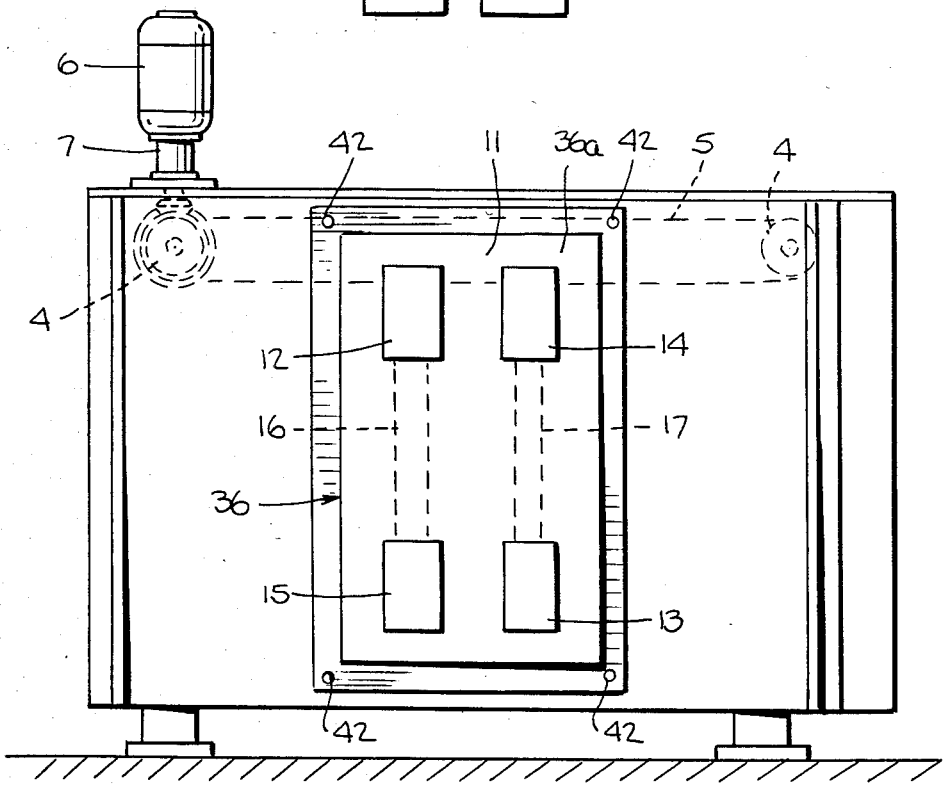
FIG. 2 is a diagrammatic side view of the FIG. 1 equipment.

FIGS. 1 and 2 illustrate a box-like reaction chamber 1, which preferably is provided at one of its ends with a lock door 2. Associated with the reaction chamber is a system, shown in dash-dot lines, for conveying substrates and comprising, for example, two sprocket wheels 3 and 4, an endless chain 5 and a drive motor 6 which acts on the sprocket wheel 4 through a reduction gear 7. Secured to the endless chain 5 is a plate-like or frame-like substrate carrier 8, which is illustrated only in FIG. 8 and the main plane of which preferably is disposed vertically. The substrate carrier can be moved backwards and forwards by means of the conveying system in the direction of the longer axis of the reaction chamber 1.

For the purpose of coating films, a winding system would be similarly provided in the reaction chamber, the shafts of this system being vertically disposed so that the film moves in approximately the same plane as the substrate carrier 8.

The reaction chamber has several walls including a front wall 9, in which is releasably secured a support frame 10, the details of which will be explained by reference to FIGS. 3, 4 and 6. Located in front of this carrier frame is a microwave screen 11 in the form of a box-like housing in front of which preferably are disposed—in an anti-parallel arrangement—two microwave emitters 12 and 13 and two reactive loads 14 and 15. Details of these emitters and reactive loads form part of the prior art, so that a detailed description is not necessary.

Located within the microwave screen 11 and between each microwave emitter and reactive load preferably is a wave-guide structure 16, 17, illustrated in broken lines in FIG. 2 and of the description explained previously herein. The microwave emitters and reactive loads preferably are connected to the wave-guide structures by hollow conductors 18 (FIGS. 1 and 4).

Figure 3:
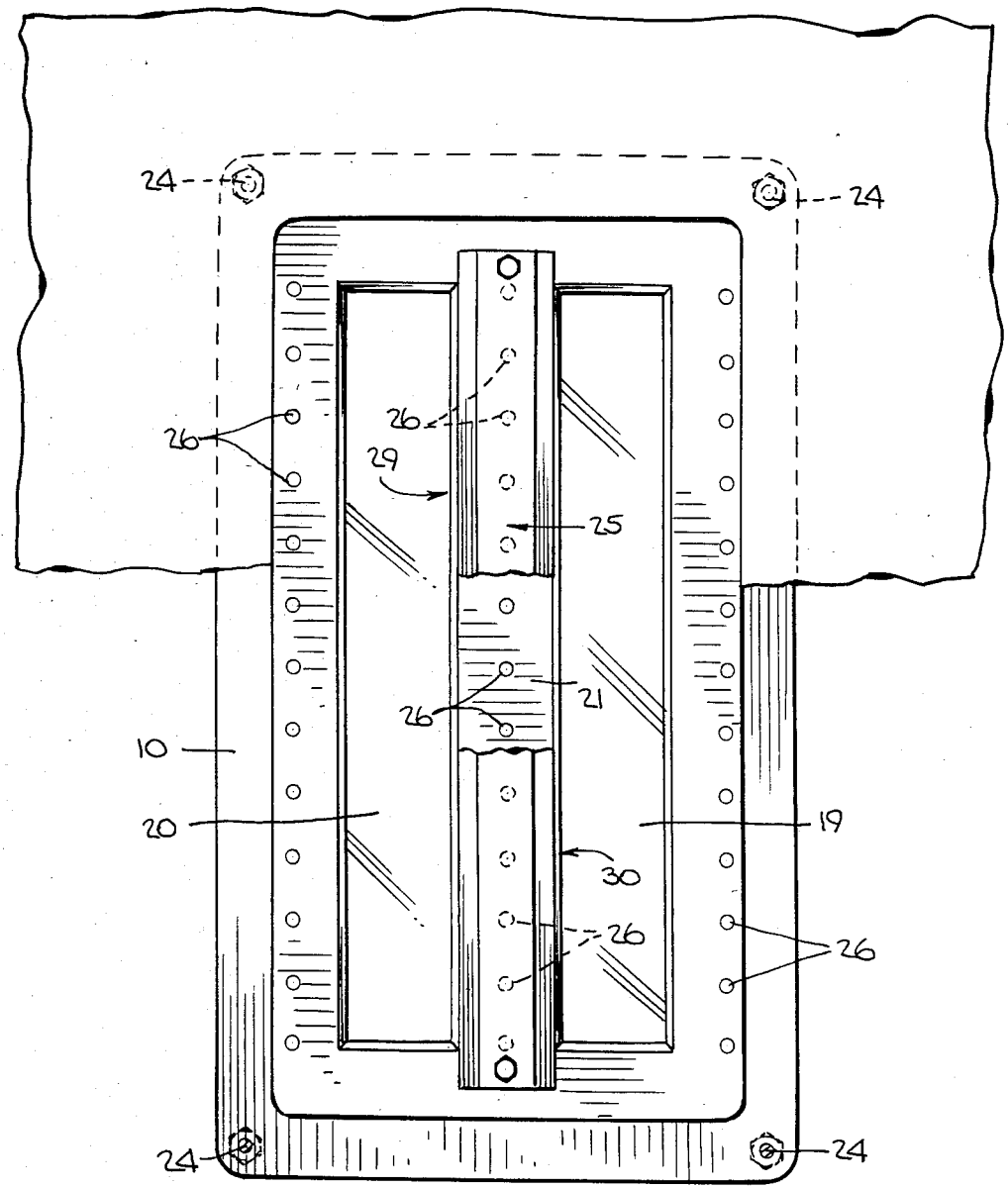
FIG. 3 is a plan view of a support frame with two windows, penetrable by microwaves and arranged one at each side of a frame strut.

It will be seen from FIG. 3 that the support frame 10 preferably is of rectangular structure and preferably is provided with two window openings 19 and 20 which extend parallel to the longer sides of the rectangle. Between the window openings preferably is a frame strut 21 which extends in the direction of the longer axis of symmetry of the support frame 10. Fitted in the openings 19 and 20 are windows 22 and 23, penetrable by microwaves; these windows preferably are made of quartz glass and are shown more clearly in FIGS. 4 and 6. Referring also to FIG. 7, at its outer corners the support frame 10 preferably comprises holes 24 for means for effecting a screwed connection with the front wall 9. Along its longer axis, the frame strut 21 preferably comprises means 25 for distributing gas and/or a monomer, which means, in the present case, comprises a number of openings 26 which discharge into the interior of the reaction chamber 1.

Figure 4:
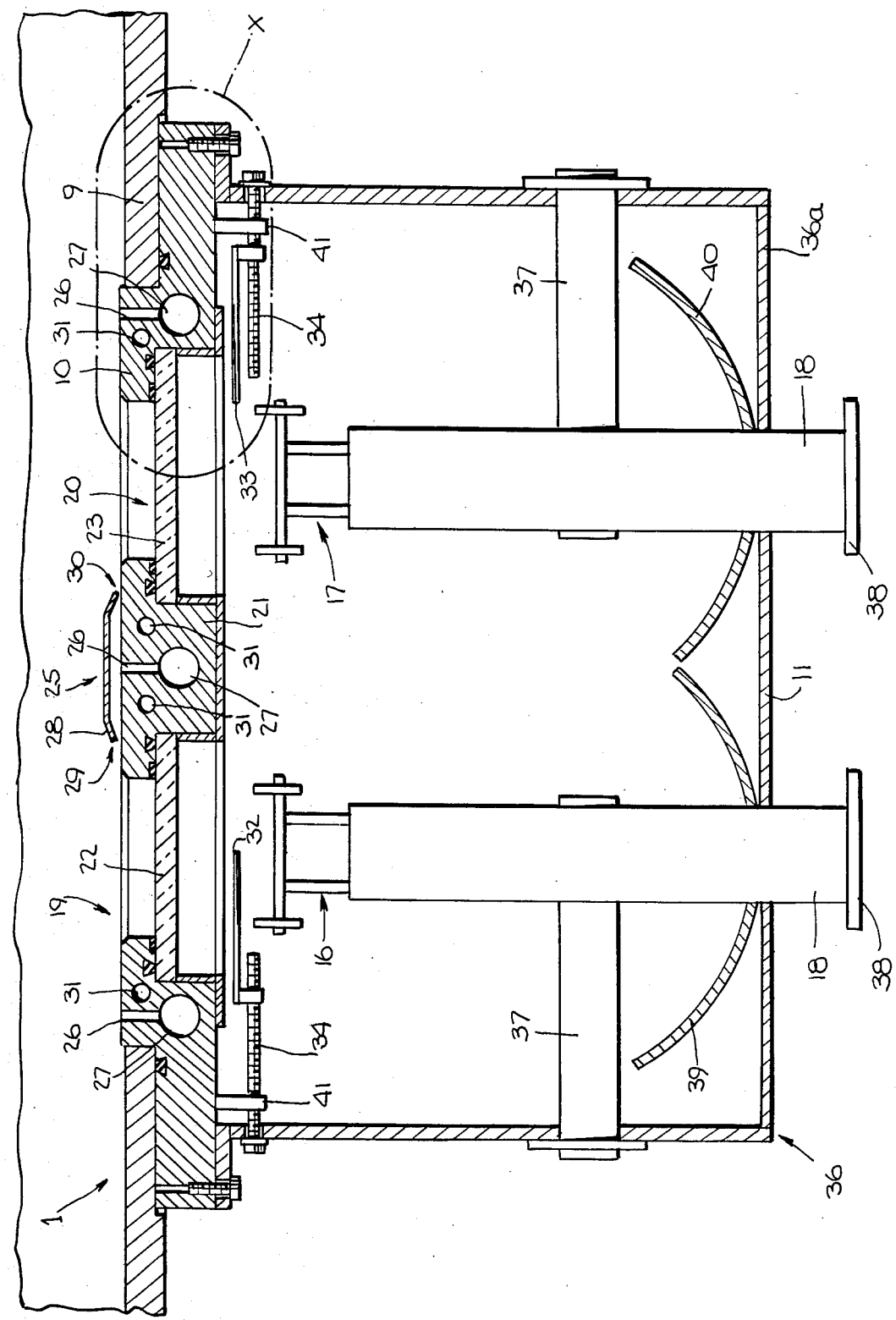
FIG. 4 shows, on a larger scale, a horizontal section through the support frame schematically representing wave-guide structures arranged in front of the windows and with a common microwave screen.

Further details of the distributing means 25 are shown in FIG. 4. The openings 26 extend at right angles to a longitudinal bore 27, which is formed in the frame strut 21 and which, in turn, and in a manner not illustrated, is connected to a pipe for supplying gases and/or monomers from which a surface layer is to be formed on the substrates by a deposition reaction. Extending parallel to the longitudinal bore 27 and opposite all the holes 26 in the central frame strut preferably is a continuous distributor plate 28, the parallel longitudinal edges of which preferably are slightly bent, in the manner illustrated, towards the frame strut 21, so that two gas-outlet gaps 29 and 30 are formed between the frame strut 21 and the distributor plate 28, which gaps extend over the entire length of the frame strut 21. If a substrate carrier or a film is moved parallel to the windows 22 and 23 and the direction of movement is at right angles to the longitudinal axis of the frame strut 21, the entire width of the substrate carrier and therefore of the substrates or film are swept by a uniform stream of gases and/or monomers. Under the effect of the glow discharges occurring to the rear of the windows 22 and 23, a corresponding coating is formed on the surface of the substrates.

Also longitudinal borings 27 having openings 26 preferably are located in the outer portions of the frame for feeding additional gas/monomer mixture.

FIG. 4 shows also that, in addition to the longitudinal bores 27, cooling ducts 31 preferably are provided in the support frame 10, including the frame strut 21, which ducts, during operation of the equipment, carry cooling water and keep the entire temperature of the support frame 10 at a lower level. The special importance of these cooling ducts 31 will be described in greater detail in connection with FIG. 6, which shows the part "X" in FIG. 4 on a larger scale.

As shown in FIG. 4, adjustable shields preferably are arranged between the wave-guide structures 16 and 17 and the window openings 19 and 20; by means of these shields, the distribution of the energy entering the reaction chamber is intentionally variable in the longitudinal direction of the window openings 19 and 20. The adjustable shields preferably are secured at both ends to setting spindles 34, 35 which enable the location of the adjustable shields 32 and 33 to be set parallel to the plane of the windows. (See also FIG. 5).

As shown in FIG. 4, the wave-guide structures 16 and 17 are surrounded by a common microwave screen 36 at the side facing away from the windows 22 and 23, which screen 36 takes the form of a metal box which is open at that of its sides facing the windows. The hollow conductors 18 and therefore also the wave-guide structures 16 and 17 are secured by support elements 37 to the microwave screen, so that a firm three-dimensional arrangement is achieved. The microwave emitters and reactive loads are connected by means of connecting flanges 38. The microwave screen 36 comprises a rear wall 36a, through which the hollow conductors 18 pass. Two reflectors 39 and 40 extend parallel to the rear wall 36a and these preferably take the form of part-cylindrical dishes and preferably are aligned with the wave-guide structures 16, 17 and the window openings 19, 20. Because of the presence of these reflectors, a considerably greater proportion of the microwave power finds its way into the interior of the reaction chamber 1.

Finally, FIG. 4 also shows that the setting spindles 34 for the adjustable shields 32 and 33 preferably extend outwardly through the screen 36 so that setting can be carried out from the exterior in a simple manner.

Figure 5:
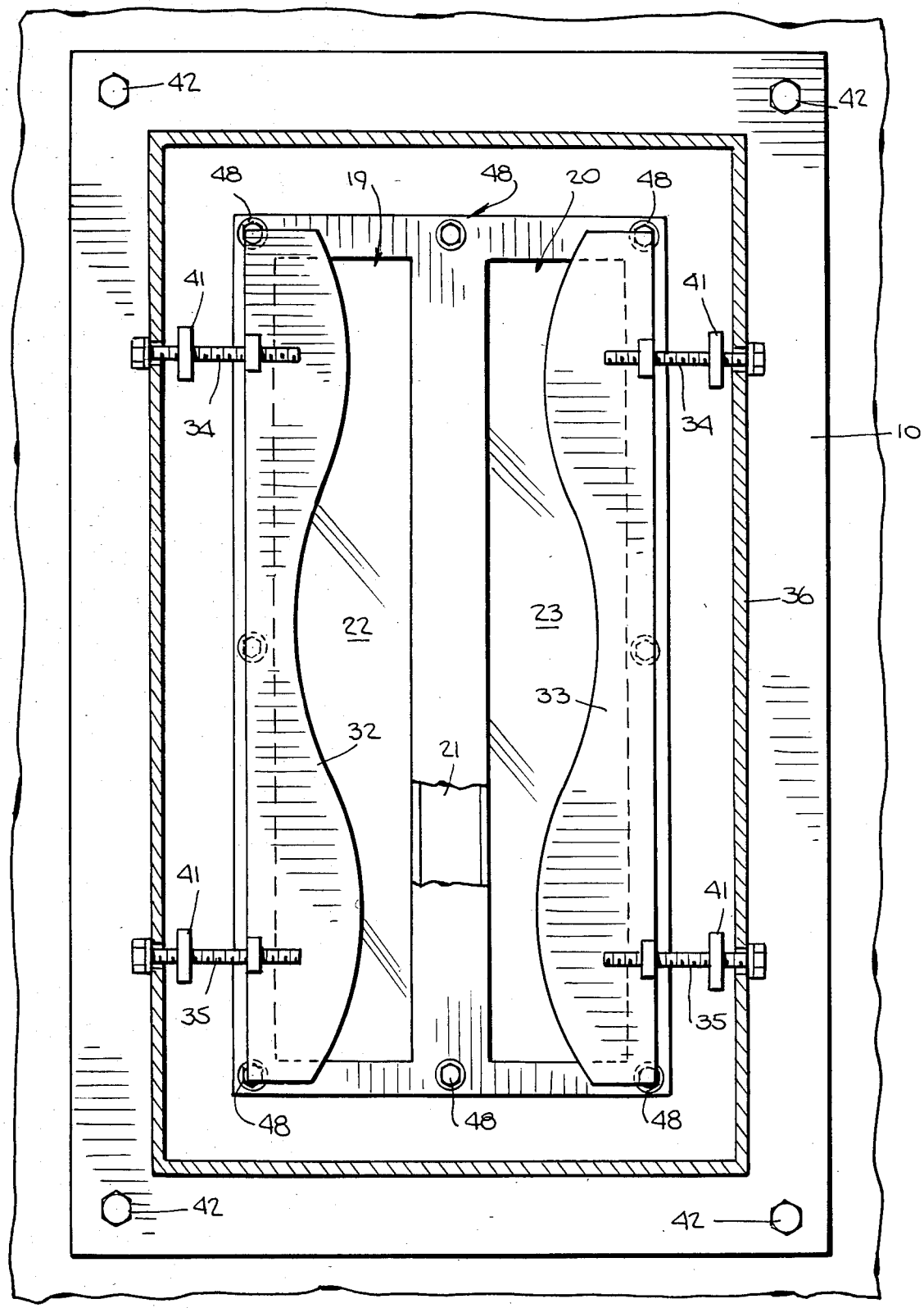
FIG. 5 is a plan view of the support frame similar to that of FIG. 3 but taken outside the reaction chamber and with adjustable shields in different positions.

FIG. 5 shows the arrangement of the adjustable shields 32 and 33 and the method of displacing them in relation to the support frame 10 and the window openings 19 and 20. Each of the adjustable shields preferably is secured to an upper setting spindle 34 and a lower setting spindle 35, so that the adjustable shields can be optionally brought from the extracted position, shown in solid lines, into any required position. The adjustable shields preferably are made of metal so that various widths of gap can be created by their relative position to the edges of the window opening, and each uncovered cross-section constitutes a measure of the input of energy into the reaction chamber. It will be seen from a comparison with FIG. 2 that the adjustable shields also extend over that portion of the wave-guide structures 16 and 17 that are connected to the hollow conductors of microwave emitters on the one hand and the reaction load on the other. The setting spindles 34 and 35 are mounted in bearings 41 which, as shown in FIG. 4, are secured to the frame 10 and are displaceable from the reaction chamber with the support frame as a unit. This is indicated only schematically in FIG. 5.

Figure 6:
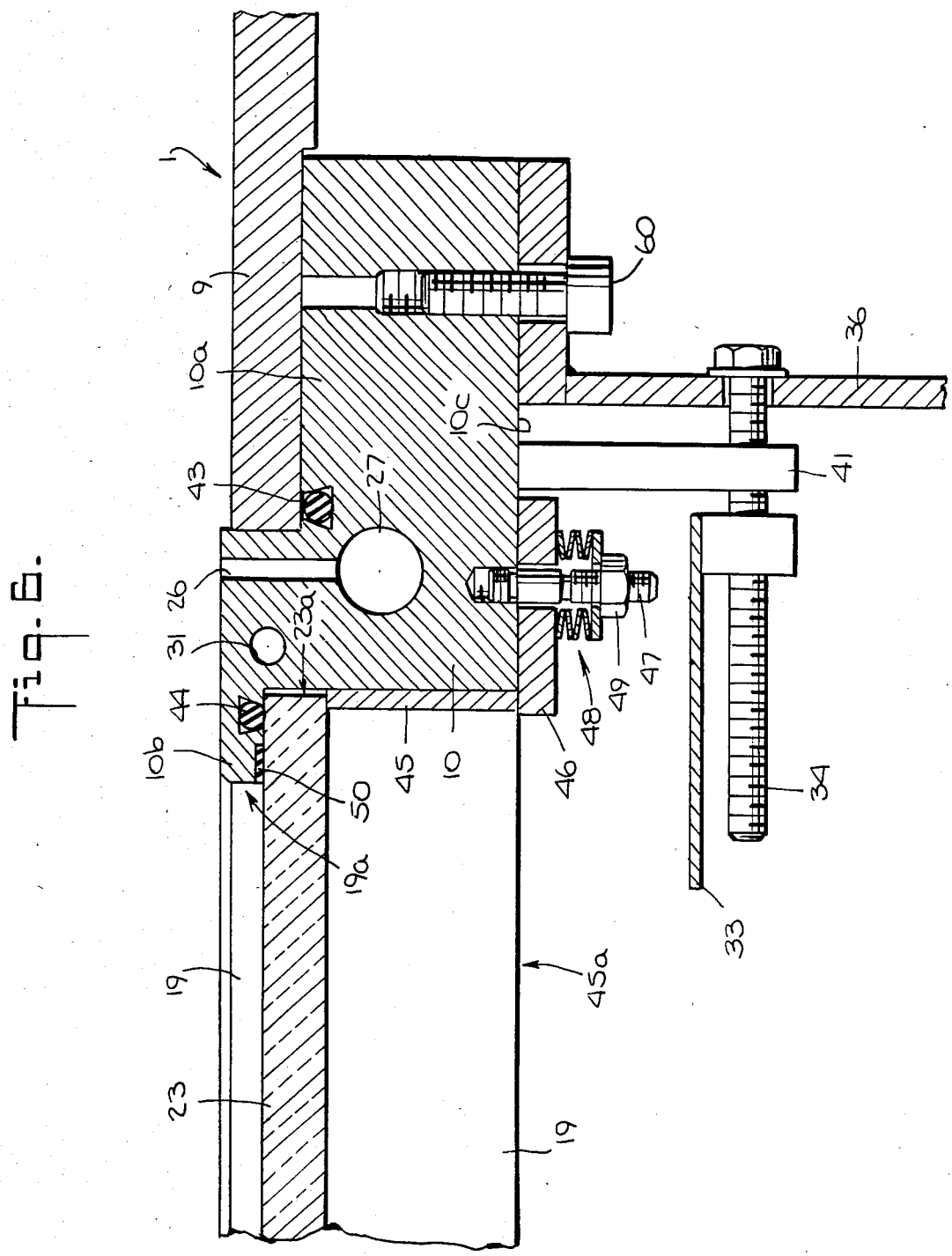
FIG. 6 is a cross-section, again on a larger scale, through a profile of the support frame and a portion of the common microwave screen as well as a portion of the reaction chamber.

FIG. 6 shows important details which relate to the cooling of the windows 22 and 23; (only the window 23 is illustrated in FIG. 6). The support frame 10 preferably comprises an outwardly directed flange 10a for sealed connection with the front wall 9 of the reaction chamber 1, and said support frame preferably also has an inwardly directed flange 10b for sealed connection with the window 23, penetrable by microwaves. The expressions "outwardly" and "inwardly" relate to a direction which is parallel to the plane of the windows 22, 23, i.e. to the main plane of the support frame 10.

The previously described cooling duct 31 is located in the support frame. The window 23, penetrable by microwaves, is pressed against the flange 10b, an elastomeric seal 44 being interposed between the window and this flange; the pressure is provided by a pressure-applying frame 45 and a pressure-applying plate 46 having a cut-out portion. Because of the thickness of the window 23 and the vertical dimension of the pressure-applying frame 45, the outer end edge 45a of the latter projects to a slight extent beyond the outer delimiting face 10c of the support frame, so that the pressure-applying plate 46 does not bear flat against the outer face 10c, but forms therewith a slightly tapering gap. A row of stay bolts 47, which are screwed into the support frame 10, extend through, and are distributed along the periphery of, the pressure-applying plate 46. By means of a set of spring washers 48 and with the aid of a nut 49, a pressure is applied to the plate 46, which pressure is transmitted through the pressure-applying frame 45 to the window 23. Preferably suitable bolts 60 distributed along a flange of the screen 36 secure the screen 36 to the support frame 10.

Referring to FIG. 7 the support frame 10 is secured in a vacuum tight but releasable manner to the front wall 9 by means of the holes 24 and screws 42. Referring again to FIG. 6 an elastomeric seal 43 is interposed between frame and wall.

A heat-conducting flexible intermediate layer 50 of graphite felt, which completely surrounds the window 23 in the manner of a frame, preferably is arranged between the inner edge 19a of the window opening 19 and the elastomeric vacuum seal 44, i.e., the outer edge 23a of the window 23. For the purpose of achieving good heat transfer, this heat-conducting intermediate layer is likewise compressed between the window 23 and the flange 10b by means of the pressure-applying frame 45. In this way, a kind of thermal short-circuit is created, i.e. the heat flowing from the middle of the window towards the outer edge 23a is "diverted" before reaching the seal 44 and is transmitted through the intermediate layer 50 to the flange 10b and from here to the coolant flowing in the cooling duct 31. The elastomeric seal 44 is thus effectively protected against thermal overload.

FIG. 8 shows more clearly than before the position of the support frame 10 in relation to the (movable) substrate carrier 8. The substrate carrier 8 preferably is secured by means of an angled carrier 51 to the upper strand of the endless chain 5 and can thus be moved backwards and forwards parallel to the main plane of the support frame 10 by reversing the drive motor 6. It will be seen that the main planes of the support frame 10 and the substrate carrier 8 preferably extend vertically, so that contaminating material that peels off drops onto the bottom 52 of the reaction chamber 1. In order to prevent swinging or lateral deflection of the substrate carrier 8, the bottom 52 is provided with supports 53 carrying a guide-rail 54, against which the substrate carrier 8 bears by way of a guide roller 55. The reaction chamber 1 preferably is reinforced to counter the low operating pressure by means of stiffening plates 1a, 1b and 1c.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. Apparatus for coating substrates by means of a reaction for depositing atoms or molecules which is initiated by a plasma, which apparatus comprises:
   a reaction chamber, including means for transporting the substrates, for containing an atmosphere comprising ionized gas and comprising, in one of its walls, two windows penetrable by microwaves;

one or more wave-gude structures disposed outside said chamber and in front of said windows;

means for distributing gas in said chamber; and a support frame at said reaction chamber, said support frame being of rectangular shape and comprising said two windows which extend parallel to the longer sides of the rectangle and a frame strut between said two windows, the apparatus also comprising cooling ducts, beside said windows, in said support frame, said distributing means being at least partially disposed in said frame strut;

said windows, penetrable by microwaves, said one or more wave-guide structures and said distributing means being secured jointly to said support frame and said support frame being secured to said reaction chamber in such manner that said windows, said one or more wave-guide structures, said distributin means and said support frame are displaceable from said reaction chamber as a unit.

2. Apparatus according to claim 1 which comprises a wave-guide structure disposed in front of each window, and in which said wave-guide structures extend in an anti-parallel manner.

3. apparatus according to claim 2 which comprises a microwave screen surrounding said wave-guide structures at that side facing away from said windows.

4. Apparatus according to claim 3 in which said screen has a rear face and which apparatus comprises curved reflectors disposed at said rear face.

5. Apparatus according to claim 1 in which said strut has a longitudinal bore and a plurality of equidistantly spaced openings, extending at right angles to said longitudinal bore, and in which said longitudinal bore communicates with the interior of said reaction chamber through said plurality of spaced openings, said distributing means comprising said plurality of spaced openings.

6. Apparatus according to claim 5 in which said distributing means comprises a distributor plate disposed opposite said openings.

7. Apparatus according to claim 1 in which said support frame and said one or more windows have a main plane which is disposed vertically.

8. Apparatus according to claim 1 which includes adjustable shields disposed between said wave-guide structures and said windows and displaceable from said reaction chamber with said support frame as a unit.

9. Apparatus according to claim 8 in which said adjustable shields are formed by narrow strips of sheet metal, are substantially parallel to said windows, and are displaceable transversely of said windows at both ends and independently of each other.

10. Apparatus according to claim 8 in which said shields have edges shaped in such manner as to minimize non-uniformities in the plasma.

11. Apparatus according to claim 1 in which said support frame comprises an outwardly directed flange for sealed connection to the reaction chamber and an inwardly directed flange, having an inner edge, for sealed connection to one of said windows, penetrable by microwaves and having an outer edge, and which includes a heat-conductive flexible intermediate layer disposed between said inner edge of said inwardly directed flange and said outer edge of said one of said windows, and a seal disposed between said outer edge of said one of the windows and said intermediate layer.

* * * * *